United States Patent [19]

Yamamoto et al.

[11] Patent Number: 4,720,834
[45] Date of Patent: Jan. 19, 1988

[54] INTERNAL-REFLECTION-INTERFERENCE SEMICONDUCTOR LASER DEVICE

[75] Inventors: Osamu Yamamoto, Nara; Hiroshi Hayashi, Kyoto; Taiji Morimoto; Saburo Yamamoto, both of Nara, all of Japan

[73] Assignee: Sharp Kabushiki Kaisha, Osaka, Japan

[21] Appl. No.: 807,867

[22] Filed: Dec. 11, 1985

[30] Foreign Application Priority Data

Dec. 15, 1984 [JP] Japan .................. 59-265079

[51] Int. Cl.$^4$ .................................................. H01S 3/19
[52] U.S. Cl. ....................................... 372/45; 372/46; 372/48; 372/49
[58] Field of Search ..................... 372/49, 48, 44, 97, 372/99, 45, 46

[56] References Cited

U.S. PATENT DOCUMENTS 4,092,657 5/1978 Ettenberg ..................... 372/49

OTHER PUBLICATIONS

Hong K. Choi and Shyh Wang, "Semiconductor Internal-Reflection-Interference Laser" Dept. of Electrical Engineering and Computer Science and Electronic Research Lab., University of California, Berkeley, California 94720, Appl. Phys. Lett. 40(7), Apr. 1, 1982, 0003-6951/82/07057.1, 1982 American Insti. of Physics, pp. 571-573.

Primary Examiner—James W. Davie
Assistant Examiner—Georgia Y. Epps
Attorney, Agent, or Firm—Ciotti, Murashige, Irell & Manella

[57] ABSTRACT

An internal-reflection-interference semiconductor laser device comprising a first laser operation area ranging from one facet to the internal reflecting section and a second laser operation area ranging from the other facet to the internal reflecting section, wherein when the internal-cavity length $l_1$ of the first laser operation area is shorter than the internal-cavity length $l_2$ of the second laser operation area, the reflectivity $R_1$ at the facet on the side of the first laser operation area is smaller than the reflectivity $R_2$ at the facet on the side of the second laser operation area.

3 Claims, 7 Drawing Figures

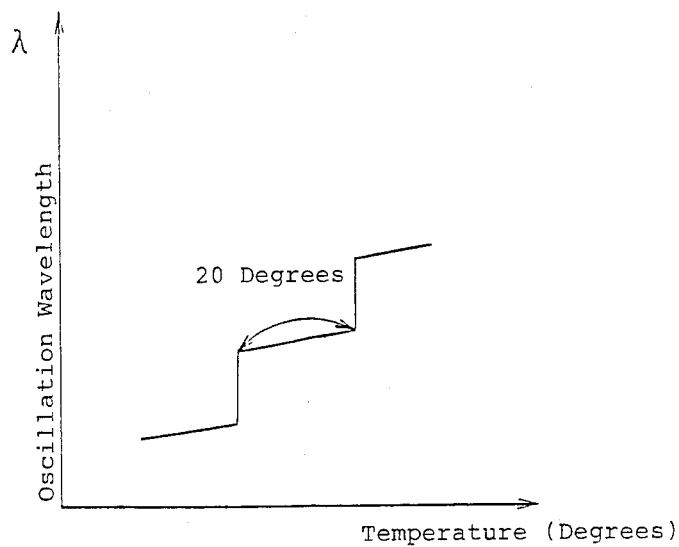
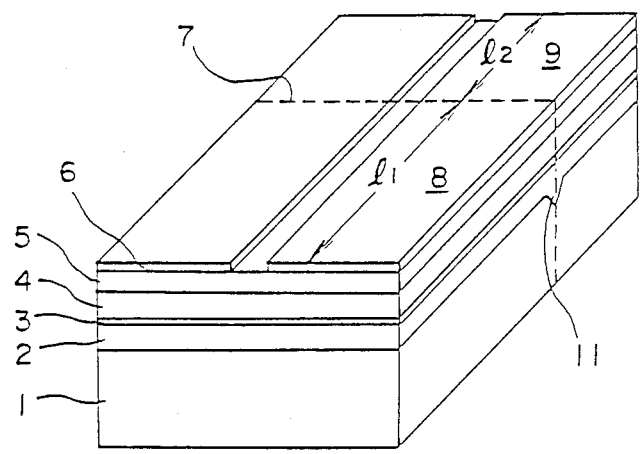
FIG. 5

INTERNAL-REFLECTION-INTERFERENCE SEMICONDUCTOR LASER DEVICE

BACKGROUND OF THE INVENTION

1. Field of the Invention

This invention relates to a semiconductor laser device, especially, an internal-reflection-interference semiconductor laser device, which has a stabilized oscillation wavelength over a wide range of temperatures.

2. Background of the Invention

Semiconductor laser devices which are being mass-produced can oscillate at a low threshold current level, and their various characteristics, such as the single transverse mode, the single longitudinal mode, and life span have satisfactory qualities. However, problems remain to be solved with regard to the stability of the oscillation wavelength in longitudinal modes. With changes in temperature or in the driving current, the oscillation wavelength changes continuously or discontinuously, and moreover, optical output power noise is generated. In particular, this noise is accentuated when the laser devices are irradiated with light from the outside, and/or laser light output is reflected by external optical devices.

In order to solve these problems, internal-reflection-interference semiconductor laser devices have been proposed, an example of which is shown in FIG. 5. This laser device has an n-substrate 1, an n-cladding layer 2, an active layer 3, a p-cladding layer 4, a p-cap layer 5, and a current-blocking oxide film 6. The reference 7 is an internal reflecting section, in which the portion of the active layer 3 (or the cladding layer 2) corresponding to the channel 11, which is constructed to be perpendicular to the laser oscillation direction is different in thickness from the other portion of the active layer 3 (or the cladding layer 2), so that this reflecting section 7 attains an internal reflection effect. The resulting wafer is separated by the reflecting section 7 into two laser operation areas 8 and 9, one (i.e., a first operation area 8) having the internal-cavity length $l_1$ and the other (i.e., a second operation area 9) having the internal-cavity length $l_2$. Due to the interference effect of lights attained between the laser operation areas 8 and 9, stability of the oscillating wavelength in longitudinal modes can be expected.

The space $\Delta\lambda_1$ between the longitudinal modes of the first laser operation area 8 is proportional to $\lambda^2/2\bar{n}l_1$, and the space $\Delta\lambda_2$ between the longitudinal modes of the second laser operation area 9 is proportional to $\lambda^2/2\bar{n}l_2$, wherein $\lambda$ is the oscillation wavelength and $\bar{n}$ is the refractive index of the active layer. Moreover, due to the interference of the longitudinal modes between the first laser operation area 8 and the second laser operation area 9, a broad space $\Delta(=\lambda^2/2\bar{n}|l_2-l_1|)$ between the longitudinal modes is created so that a stabilized oscillation can be attained in only the longitudinal mode around the peak of the gain distribution.

However, with an internal-reflection-interference semiconductor laser device mentioned above, it is difficult to obtain a strong reflection from the internal reflecting area 7. Therefore, because the selectivity for the wavelength is poor, it is not possible to stabilize the longitudinal mode over a wide range of temperatures. Thus, in practice, the oscillation wavelength is stabilized over a temperature difference of 5°–10° C. at the most. Moreover, it is impossible to suppress completely the instability of a longitudinal mode arising from reflected light.

SUMMARY OF THE INVENTION

The semiconductor laser device of this invention which overcomes the above-discussed and numerous other disadvantages and deficiencies of the prior art, comprises a first laser operation area ranging from one facet to the internal reflecting section and a second laser operation area ranging from the other facet to the internal reflecting section, wherein when the internal-cavity length $l_1$ of the first laser operation area is shorter than the internal-cavity length $l_2$ of the second laser operation area, the reflectivity $R_1$ at the facet on the side of the first laser operation area is smaller than the reflectivity $R_2$ at the facet on the side of the second laser operation area.

The internal reflecting section is, in a preferred embodiment, located along a V-shaped channel which is formed on the substrate in a manner to be perpendicular to the laser oscillation direction.

Thus, the invention described herein makes possible the objects of (1) providing an internal-reflection-interference semiconductor laser device which has a stabilized oscillation wavelength over a wide range of not only temperatures but also injection driving currents and which suppresses the instability of a longitudinal mode arising from reflected light thereto; and (2) providing an internal-reflection-interference semiconductor laser device which suppresses noise resulting from reflected light thereto.

BRIEF DESCRIPTION OF THE DRAWINGS

This invention may be better understood and its numerous objects and advantages will become apparent to those skilled in the art by reference to the accompanying drawings as follows:

FIG. 4 is a characteristic curve showing the dependence of the oscillation wavelength $\lambda$ on temperature with regard to the semiconductor laser device shown in FIG. 3.

FIG. 5 is a perspective view of an internal-reflection-interference semiconductor laser device.

DESCRIPTION OF THE PREFERRED EMBODIMENTS

Figure 1:
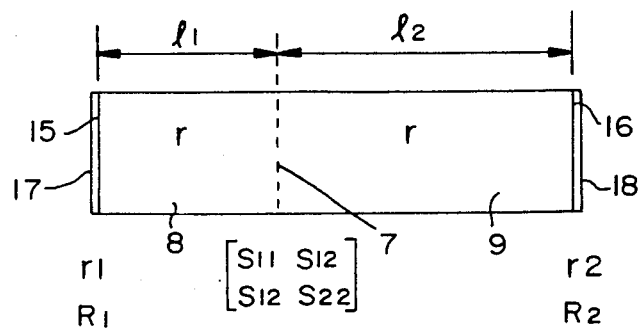
FIG. 1 is a diagrammatical side view showing the internal-reflection-interference semiconductor laser device of this invention.

This invention is based on the following principle: when an internal-reflection-interference semiconductor laser device comprises a waveguide having such an internal reflecting section 7 as shown in FIG. 1, the effective reflectivity $r^2_{\text{eff}}$ is represented by the following equation (1) according to Shyh Wang et al's proposal (Appl. Phys. Lett. 40(7), 571, 1982):

$$r^2_{\text{eff}} = r_1 r_2 (S_{12}^2 - S_{11}^2) + (S_{11} r_1 e^{-2\Gamma l_2} + S_{22} r_2 e^{-2\Gamma l_1}) \quad (1)$$

wherein $r_{\text{eff}}$ is the effective reflectivity of an electric field; $r_1$ and $r_2$ are the reflectivities of an electric field at the facets, respectively; $S_{11}$ is the reflectivity of an electric field of the internal reflecting section 7 on the side of the first laser operation area 8; $S_{22}$ is the reflectivity of an electric field of the internal reflecting section 7 on the side of the second laser operation area 9 (wherein $S_{11} = S_{22}$); $S_{12}$ is the transmission index of an electric field of the internal reflecting section 7; $l_1$ and $l_2$ are the internal-cavity lengths of the waveguides in the first laser operation area 8 and the second laser operation area 9, respectively; and $\Gamma$ is the propagation constant of the oscillation wavelength in the waveguide.

The power reflectivities at the facets $R_1$ and $R_2$, respectively, are defined by the equations $R_1 = r_1^2$ and $R_2 = r_2^2$. Given that the internal loss is g, the refractive index of the waveguide is n, and the wavelength is $\lambda$, the propagation constant $\Gamma$ can be defined by the equation $\Gamma = g + i(2\pi \bar{n}/\lambda)$.

From the equation (1), the following equation (2) can be derived:

$$r^2_{\text{eff}} = \sqrt{R_1} \sqrt{R_2} (S_{12}^2 - S_{11}^2) + S_{11} \{ \sqrt{R_1} \ e^{-2gl_2} \cos (4\pi \bar{n} l_2 / \lambda) + \sqrt{R_2} \ e^{-2gl_1} \cos (4\pi \bar{n} l_1 / \lambda) \} \quad (2)$$

Figure 2A:
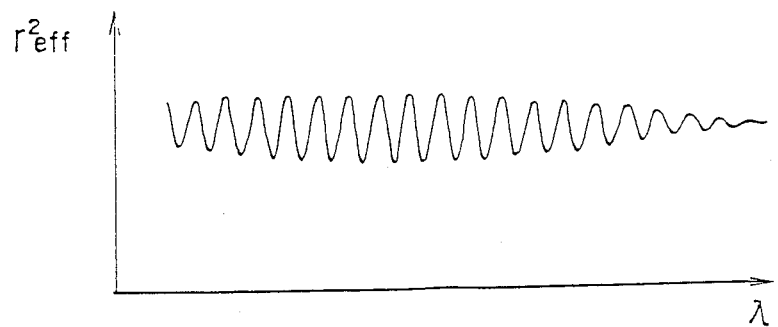
FIGS. 2(a), 2(b) and 2(c), respectively, are graphs illustrating the relationship between the oscillation wavelength $\lambda$ and the effective reflectivity $r^2_{\text{eff}}$ when the internal-cavity length $l_1$ of the first laser operation area 8 is nearly equal to the internal-cavity length $l_2$ of the second laser operation area 9, the relationship between the oscillation wavelength $\lambda$ and the effective reflectivity $r^2_{\text{eff}}$ when the internal-cavity length $l_1$ is shorter than the internal-cavity length $l_2$, and the relationship between the oscillation wavelength $\lambda$ and the effective reflectivity $r^2_{\text{eff}}$ when the internal-cavity length $l_1$ is shorter than the internal-cavity length $l_2$ and the reflectivity $R_1$ at the facet 15 on the side of the first laser operation area 8 is smaller than the reflectance $R_2$ at the other facet 16 on the side of the second laser operation area 9.
Figure 2B:
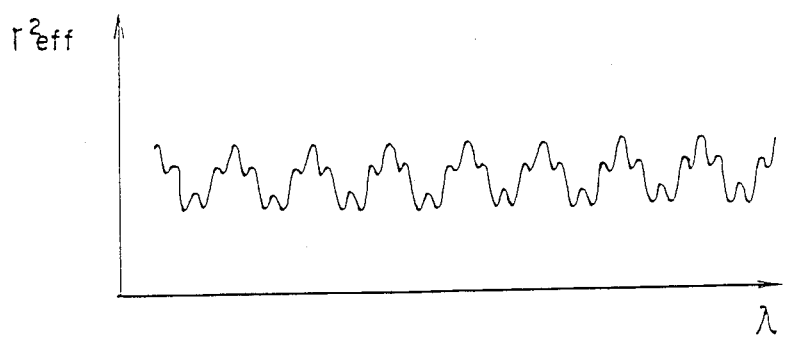
Figure 2C:
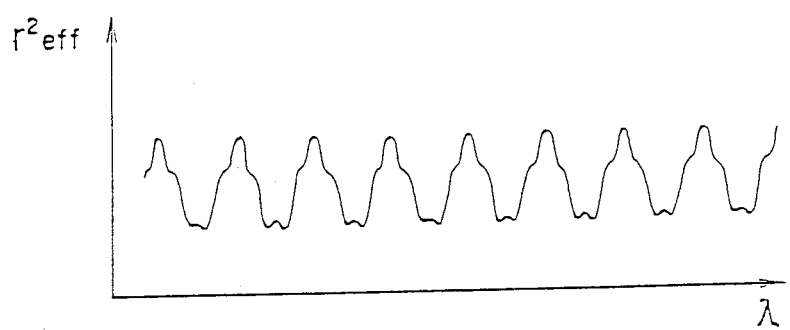

The selectivity for the wavelength can be determined by the second term in the equation (2), i.e., the sum of the periodic functions which depend upon $l_1$ and $l_2$. Given that $l_1$ is nearly equal to $l_2$, an $r^2_{\text{eff}}$ such as that shown in FIG. 2(a) can be provided. Given that $l_1$ is considerably shorter than $l_2$ (i.e., $l_1 < < l_2$, and thus $e^{-2gl_2} < e^{-2gl_1}$), an $r^2_{\text{eff}}$ such as that shown in FIG. 2(b) can be provided, indicating that the selectivity for the wavelength is increased. Given that $R_1$ is smaller than $R_2$ (i.e., $R_1 < R_2$, and thus $\sqrt{R_1} e^{-2gl_2} < < \sqrt{R_2} e^{-2gl_1}$), an $r^2_{\text{eff}}$ such as that shown in FIG. 2(c) can be provided, indicating that the degree of modulation is greater than that in FIG. 2(b) so that the selectivity for the wavelength is further increased, resulting in a stabilized oscillation wavelength over a wide range of temperatures and achieving the minimization of optical output power noise resulting from reflected light.

Conventional internal-reflection-interference semiconductor laser devices have been designed to increase the internal reflection index $S_{11}$. On the contrary, the internal-reflection-interference semiconductor laser device of this invention is designed in such a manner that the internal-cavity length $l_1$ of the first laser operation area 8 is shorter than the internal-cavity length $l_2$ of the second laser operation area 9, and moreover the power reflectivity $R_1$ at the facet 15 of the first laser operation area 8 is smaller than the power reflectivity $R_2$ at the facet 16 of the second laser operation area 9, thereby allowing for an increase in the wavelength selectivity so that the stability of the oscillation wavelength can be attained over a wide range of temperatures.

EXAMPLE

Figure 3:
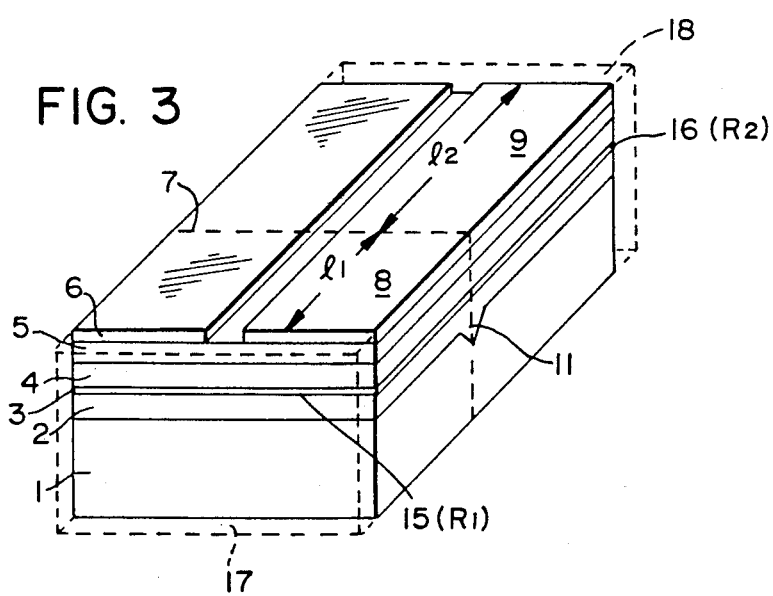
FIG. 3 is a perspective view showing the internal-reflection-interference semiconductor laser device of this invention.

FIG. 3 shows an internal-reflection-interference semiconductor laser device of this invention, which comprises, in sequence, an n-substrate 1 having a V-shaped channel 11 which is perpendicular to the laser oscillation direction, an n-cladding layer 2, an active layer 3, a p-cladding layer 4, a p-cap layer 5, and a current-blocking oxide film 6. Along the V-shaped channel 11, the internal reflecting section 7 is located, by which the wafer is separated into two portions, i.e., the first laser operation area 8 and the second laser operation area 9. The above-mentioned structure of this invention is the same as that of the conventional internal-reflection-interference semiconductor laser device shown in FIG. 5 except for the following matters.

The internal-cavity length $l_1$ of the first laser operation area 8 is shorter than the internal-cavity length $l_2$ of the second laser operation area 9, and the reflectivity $R_1$ at the front facet 15 emitting light therefrom on the side of the first laser operation area 8 is smaller than the reflectivity $R_2$ at the back facet 16 on the side of the second laser operation area 9. The desired values of the reflectivities $R_1$ and $R_2$ at the facets 15 and 16, respectively, can be obtained by coating these facets with a multi-layered film made of dielectric substances composed of materials such as $\alpha$-Si and $\alpha$-Si/Al$_2$O$_3$, such as films 17 and 18, respectively.

The relationship between the operation temperature and the oscillation wavelength of the resulting internal-reflection-interference semiconductor laser device was examined. The results are shown in FIG. 4 which indicates that the oscillation wavelength exhibits no spectrum hopping over the temperature range of 20° C., and that the instability of a longitudinal mode resulting from reflected light can be suppressed sufficiently.

Moreover, since the reflectivity $R_1$ at the front facet 15 is smaller than the reflectivity $R_2$ at the back facet 16, the oscillation wavelength can be stabilized and a high optical output power can be produced.

The present invention is not limited to the internal-reflection-interference semiconductor laser device described in the above-mentioned Example, but it can be applied to a semiconductor laser device having a different polarity from the polarity of each of the substrate and the grown layers in the above-mentioned Example. Moreover, the present invention is not limited to the shape of the waveguide and/or the shape of the internal reflecting section described in the above-mentioned Example.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. In an internal-reflection-interference semiconductor laser device having one radiation emitting facet, another facet opposed to said radiation emitting facet, and an internal reflecting section, and comprising:
   a semiconductor substrate;
   a first electrode formed under said substrate;
   a first cladding layer formed on said substrate;
   an active layer formed on said first cladding layer;
   a second cladding layer formed on said active layer;
   a cap layer formed on said second cladding layer;
   a first laser operation area ranging from said radiation emitting facet to the internal reflecting section; and
   a second laser operation area ranging from the other facet to the internal reflecting section, wherein:
   the internal-cavity length $l_1$ of said first laser operation area is shorter than the internal-cavity length $l_2$ of said second laser operation area, and the reflectivity $R_1$ at the radiation emitting facet is smaller than the reflectivity $R_2$ at the other facet.

2. An internal-reflection-interference semiconductor laser device according to claim 1, wherein said internal reflecting section is located along a V-shaped channel which is formed on the substrate in a manner to be perpendicular to the laser oscillation direction.

3. An internal-reflection-interference semiconductor laser device comprising:
   a body of semiconductor material capable of radiation emission and having opposed first and second facet surfaces from which the radiation is capable of being emitted, said body comprising:
   a semiconductor substrate having a channel extending along one surface generally parallel with said facet surfaces, said channel being positioned closer to said first facet surface than to said second facet surface;
   a first cladding layer formed on said one substrate surface having said channel;
   an active layer formed on said first cladding layer;
   a second cladding layer formed on said active layer; and
   a cap layer formed on said second cladding layer;
   said channel defining an internal reflecting section in said body with a first laser operation area ranging from said first facet surface to said internal reflecting section and a second laser operation area ranging from said second facet surface to said internal reflecting section, said first laser operation area having a length $l_1$ less than the length $l_2$ of said second laser operation area;
   first and second reflectors disposed on said first and second facet surfaces, respectively, said first reflector producing a reflectivity $R_1$ less than the reflectivity $R_2$ produced by said second reflector.

* * * * *